(12) United States Patent
Gil (10) Patent No.: US 7,223,655 B2
(45) Date of Patent: May 29, 2007

(54) METHOD FOR MANUFACTURING NAND FLASH DEVICE

(75) Inventor: Min Chul Gil, Icheon-Shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 215 days.

(21) Appl. No.: 11/138,560

(22) Filed: May 26, 2005

(65) Prior Publication Data

US 2005/0272204 A1     Dec. 8, 2005

Related U.S. Application Data

(63) Continuation of application No. 10/876,065, filed on Jun. 24, 2004, now Pat. No. 6,930,001.

(30) Foreign Application Priority Data

Dec. 5, 2003     (KR) ............................. 2003-88265

(51) Int. Cl.
*H01L 21/336* (2006.01)

(52) U.S. Cl. ...................................... 438/257; 257/314
(58) Field of Classification Search ................ 438/157, 438/195, 257; 257/314–315, 319
See application file for complete search history.

(56) References Cited

U.S. PATENT DOCUMENTS 6,380,032 B1 *  4/2002  Lee et al. .................... 438/257

* cited by examiner

*Primary Examiner*—David Vu
(74) *Attorney, Agent, or Firm*—Marshall, Gerstein & Borun LLP (57) ABSTRACT

Disclosed is a method for manufacturing a NAND flash device. After a source line plug hole is formed, a drain contact plug hole is formed. The holes are filled with a conductive material film and are then polished. It is therefore possible to simplify the process since a blanket etch process step is omitted. Moreover, loss of a drain contact plug by the blanket etch process is prevented. It is therefore possible to improve the electrical properties of a device and reduce the manufacturing cost price.

4 Claims, 8 Drawing Sheets

METHOD FOR MANUFACTURING NAND FLASH DEVICE

This is a continuation of U.S. patent application Ser. No. 10/876,065, filed on Jun. 24, 2004, now U.S. Pat. No. 6,930,001.

BACKGROUND

1. Field of the Invention

The present invention relates to a method for manufacturing a NAND flash device, and, more specifically, to a method for forming a drain contact and a source contact in a NAND flash device.

2. Discussion of Related Art

A cell array of a NAND flash device is connected in a string unlike a common flash device. Due to this property, a drain contact and a source line contact for a global ground, which are connected by a bit line, are located at both ends of the string. These contacts are connected to the junction of a select transistor for string control.

Figure 1:
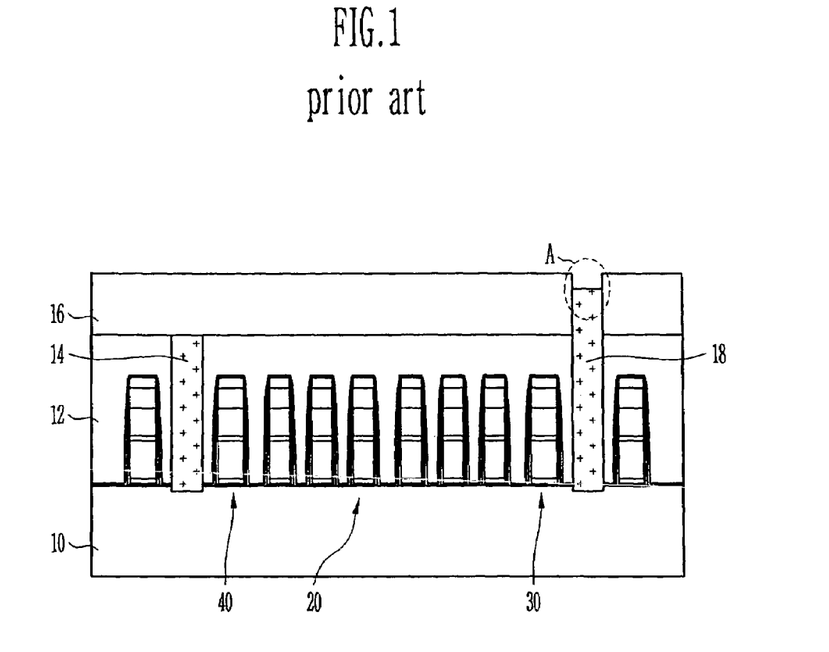
FIG. 1 is a cross-sectional view shown to explain a method for manufacturing a flash device in the related art.

FIG. 1 is a cross-sectional view shown to explain a method for manufacturing a flash device in a prior art.

Figure 2:
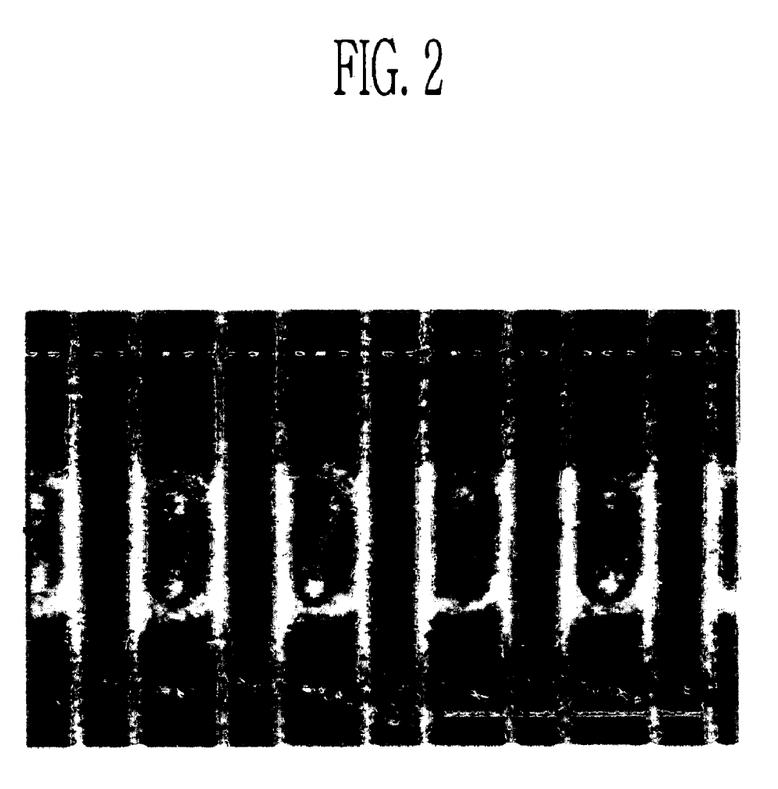
FIG. 2 is a SEM photography for explaining conventional problems.

FIG. 2 is a SEM photography for explaining conventional problems.

Referring to FIG. 1 and FIG. 2, a first interlayer insulating film 12 is formed on a semiconductor substrate 10 on which a cell string 20 for storing electrical information therein, a drain select transistor 30 for selecting a drain terminal of the cell string 20 and a source select transistor 40 for selecting a source terminal of the cell string 20 are formed.

The first interlayer insulating film 12 on a source region of the source select transistor 40 is removed by a predetermined etch process, thus forming a source line contact hole. After a polysilicon film is deposited, a chemical mechanical polishing using the first interlayer insulating film 12 as a stop layer is implemented to fill the source line contact with polysilicon, so that a source line plug 14 is formed.

A second interlayer insulating film 16 is formed. A photoresist pattern (not shown) through which a drain contact region is opened is then formed. The second and first interlayer insulating film 12 and 16 on a drain region of the drain select transistor 30 are removed by means of an etch process using the photoresist pattern as an etch mask, forming a drain contact hole. After a polysilicon film is deposited, the polysilicon film on the second interlayer insulating film 16 is removed by means of a blanket etch process. Thus, the drain contact hole is filled with polysilicon, forming a drain contact plug 18. In case of the blanket etch process, there is a danger that excessive plug poly within the contact may be lost (see "A" region in FIG. 1). Further, the blanket etch process is disadvantageous in view of process control. Excessive loss of plug poly causes a part of a nitride film for etch stop due to lack of an etch target to remain when a bit line contact and a bit line are formed by means of a subsequent damascene process. It results in degradation of electrical properties in the device (see FIG. 2).

Furthermore, one of the most critical things in the processes of forming the contacts in the NAND flash device is a formation of a drain contact. In an etch process for forming the drain contact of a NAND flash device of below 100 nm class, a margin of photoresist film is lowered. Accordingly, there is a problem that reduction in a thickness of the photoresist film is greater than reduction in a thickness of the second interlayer insulating film when the contact is etched. As described above, the drain contact plug and the source line plug are formed using independent processes. Accordingly, there is a problem that the productivity is low since a total number of masks and process steps are increased. Furthermore, it is difficult to control an overlay since each contact plug and independent mask alignment are required.

SUMMARY OF THE INVENTION

The present invention is contrived to solve the aforementioned problem. An object of the present invention is to provide a method for manufacturing a NAND flash device wherein after a source contact plug is formed, a drain contact is formed in the same level, whereby a plug formation process by the blanket etch is omitted and a process margin is secured due to reduction in a thickness of an etch layer when the drain contact is formed.

According to an aspect of the present invention, there is provided a method for manufacturing a NAND flash device, comprising the steps of: providing a semiconductor substrate on which a drain select transistor for selecting a drain terminal of a flash cell and a source select transistor for selecting a source terminal of the flash cell, wherein the drain select transistor and the source select transistor have drain region and a source region on the surface of the semiconductor substrate; forming a first interlayer insulating film over the semiconductor substrate; removing a portion of the first interlayer insulating film to form a source line contact hole, wherein the source region of the source select transistor is exposed at the bottom of the source line contact hole; removing a portion of the first interlayer insulating film to form a drain contact hole, wherein the drain region of the drain select transistor is exposed at the bottom of the drain contact hole; forming a source line plug and a drain contact plug in the source line contact hole and the drain contact hole, respectively; and forming a bit line connected to the drain contact plug and a common source line contact connected to the source line plug.

According to an aspect of the present invention, there is provided a method for manufacturing a NAND flash device, comprising the steps of: providing a semiconductor substrate on which a drain select transistor for selecting a drain terminal of a flash cell and a source select transistor for selecting a source terminal of the flash cell, wherein the drain select transistor and the source select transistor have drain region and a source region on the surface of the semiconductor substrate; forming a first interlayer insulating film over the semiconductor substrate; removing a portion of the first interlayer insulating film to form a source line contact hole, wherein the source region of the source select transistor is exposed at the bottom of the source line contact hole; removing a portion of the first interlayer insulating film to form a drain contact hole, wherein the drain region of the drain select transistor is exposed at the bottom of the drain contact hole; forming a source line plug and a drain contact plug in the source line contact hole and the drain contact hole, respectively; forming a second interlayer insulating film over the semiconductor substrate including the source line plug and the drain contact plug; forming an etch-stop layer on the second interlayer insulating layer; forming a third interlayer insulating film on etch-stop layer; selectively etching the third interlayer insulating film, the etch-stop layer and portions of the second interlayer insulating layer and forming a first trench over the drain contact plug and a second trench over the source line plug, wherein the first trench is larger than the second trench; selectively removing the second interlayer insulating layer and forming a first via hole under the first trench and the second via hole under the second trench, wherein the first via hole exposes the drain contact plug and the second via hole exposes the source line plug; filling the first trench, the second trench, the first via hole and the second via hole with a metal film; and forming a bit line passing the first trench and the first via hole and a common source line contact passing the second trench and the second via hole by polishing the metal film.

BRIEF DESCRIPTION OF THE DRAWINGS

FIG. 4A to FIG. 4G are cross-sectional views illustrating the NAND flash device taken along lines III–III' in FIG. 3 in order to explain a method for manufacturing a NAND flash device according to the present invention;

DETAILED DESCRIPTION OF PREFERRED EMBODIMENTS

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Like reference numerals are used to identify the same or similar parts.

Figure 3:
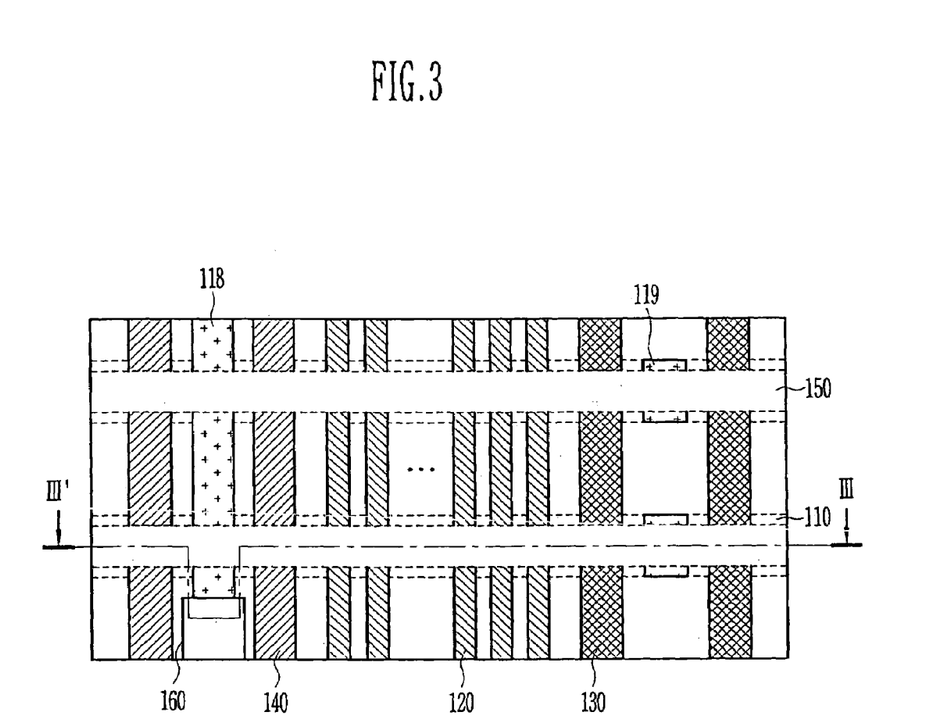
FIG. 3 shows an array of a NAND flash device according to the present invention.

FIG. 3 shows an array of a NAND flash device according to the present invention.

FIG. 4A to FIG. 4G are cross-sectional views illustrating the NAND flash device taken along lines III–III' in FIG. 3 in order to explain a method for manufacturing a NAND flash device according to the present invention.

Figure 5:
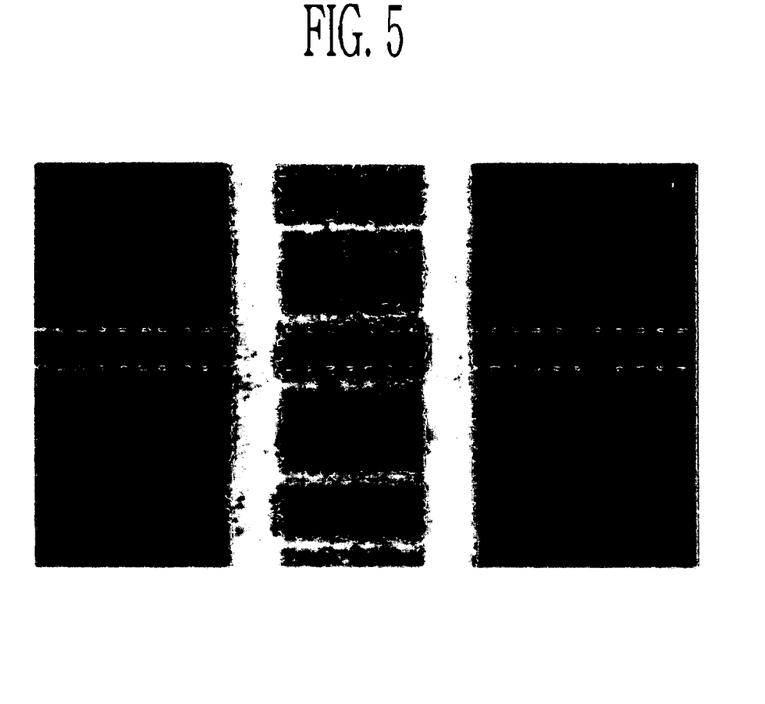
FIG. 5 is a SEM photography after a source contact is etched.

FIG. 5 is a SEM photography after a source contact is etched.

Figure 4A:
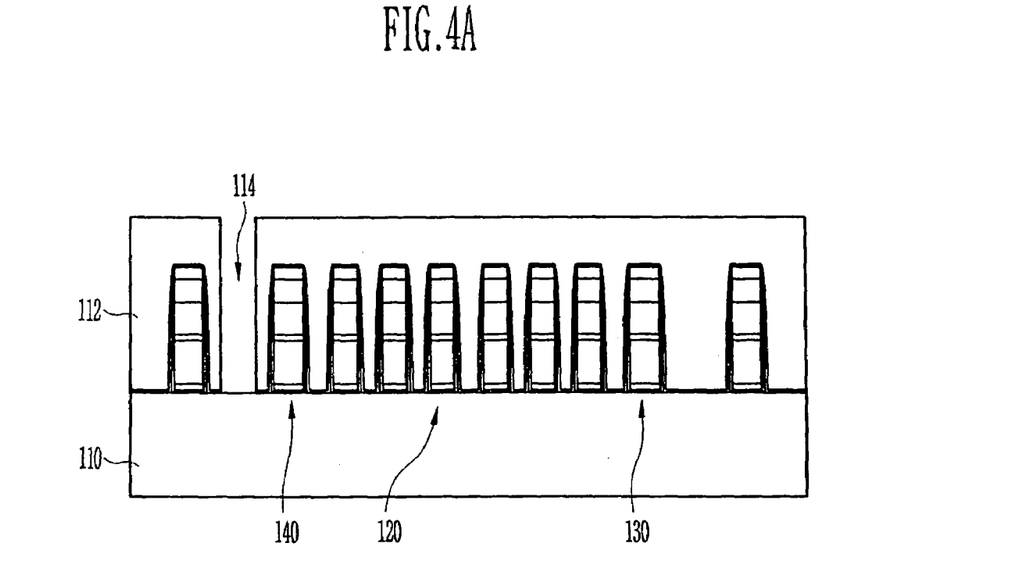

Referring to FIG. 3, FIG. 4A and FIG. 5, a first interlayer insulating film 112 is formed on a semiconductor substrate 110 on which a NAND flash cell 120, a drain select transistor 130 for selecting a drain terminal of the flash cell 120, and a source select transistor 140 for selecting a source terminal of the flash cell 120 are formed. It is preferred that the first interlayer insulating film 112 is formed to have a stacked structure consisting of an oxide film and a dielectric film. The oxide film is formed to protect the flash cell 120 and a transistor, and the dielectric material is formed to insulate each layer. The first interlayer insulating film 112 is patterned to form a source line contact hole 114.

In the above, in the formation of the NAND flash cell 120 and the drain and source select transistors 130 and 140, it is preferred that a screen oxide film (not shown) that serves to prohibit crystal defects on the substrate and serves as a buffer layer upon surface treatment and ion implantation is deposited on the semiconductor substrate 110. An ion implantation process is preferably carried out to form a well and an ion layer (not shown) for controlling the threshold voltage. It is also effective to form the well in a triple shape. After the screen oxide film is removed, a tunnel oxide film (not shown), a first conductive film (not shown) and a pad nitride film (not shown) are deposited.

After a photoresist film is covered on the pad nitride film, a photolithography process using a photoresist film mask is performed to form a photoresist pattern (not shown). The pad nitride film, the first conductive film, the tunnel oxide film and the semiconductor substrate are etched by means of an etch process using the photoresist pattern as an etch mask, thus forming a trench of a shallow trench isolation (STI) structure. A high-density plasma (HDP) oxide film is deposited to fill the trench. It is preferred that an isolation film is formed by removing the HDP oxide film on the pad nitride film by means of a polishing process using the pad nitride film as a stop layer.

The pad nitride film is experienced by a dipping-out with $H_3PO_4$ so that a portion of the isolation film is exposed. A native oxide film and the remnants formed on the first conductive film are removed by means of a pre-treatment cleaning process using DHF. After a second conductive film (not shown) is deposited, a portion of the second conductive film is patterned to form a floating gate electrode.

A dielectric film (not shown) is deposited in conformity to an entire structure including the floating gate. A third conductive film (not shown) for forming a control gate, a tungsten silicide ($WSi_x$) film and a hard mask film (not shown) are then sequentially deposited. It is preferable that the dielectric film has an $ONO(SiO_2—Si_3N_4—SiO_2)$ structure. A gate mask and etching process and a self-aligned mask and etching process are performed to form a control gate electrode, so that the gate electrode for the flash cell and the gate electrode for the transistor are formed. Next, an ion implantation process is carried out to form source/drain. In order to protect the gate electrodes formed as above, it is effective that an oxide film is formed on an entire structure including the gate electrodes in the ion implantation process.

A source line contact hole is formed as follows.

A photoresist film is covered on the first interlayer insulating film 112. A photolithography process using a photoresist film mask is then implemented to form a first photoresist pattern (not shown) through which a source line region is opened It is effective that the source region of the source select transistor 140 is opened since the device is a NAND flash device. The first interlayer insulating film 112 is removed by means of an etch process using the first photoresist pattern as an etch mask, thus forming a source line contact hole 1114. The first photoresist pattern is removed by means of a predetermined photoresist film strip process.

Figure 6:
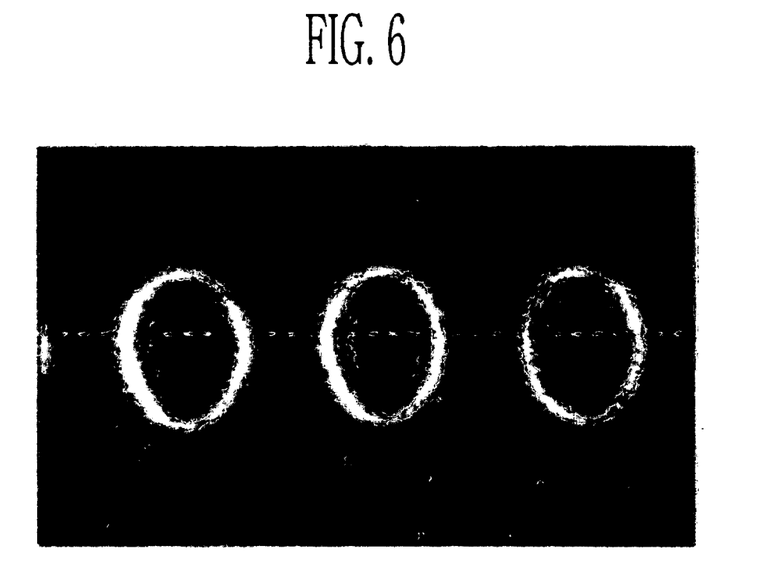
FIG. 6 is a SEM photography after a drain contact hole is formed.

FIG. 6 is a SEM photography after a drain contact hole is formed.

Referring to FIG. 3, FIG. 4B, FIG. 4C and FIG. 6, the first interlayer insulating film 112 on the drain is removed by means of a patterning process, thus forming a drain contact hole 116. The source line contact hole 114 and the drain contact hole 116 are filled with a conductive material film and are then polished to form a source line contact plug 118 and a drain contact plug 119, respectively.

Figure 4B:
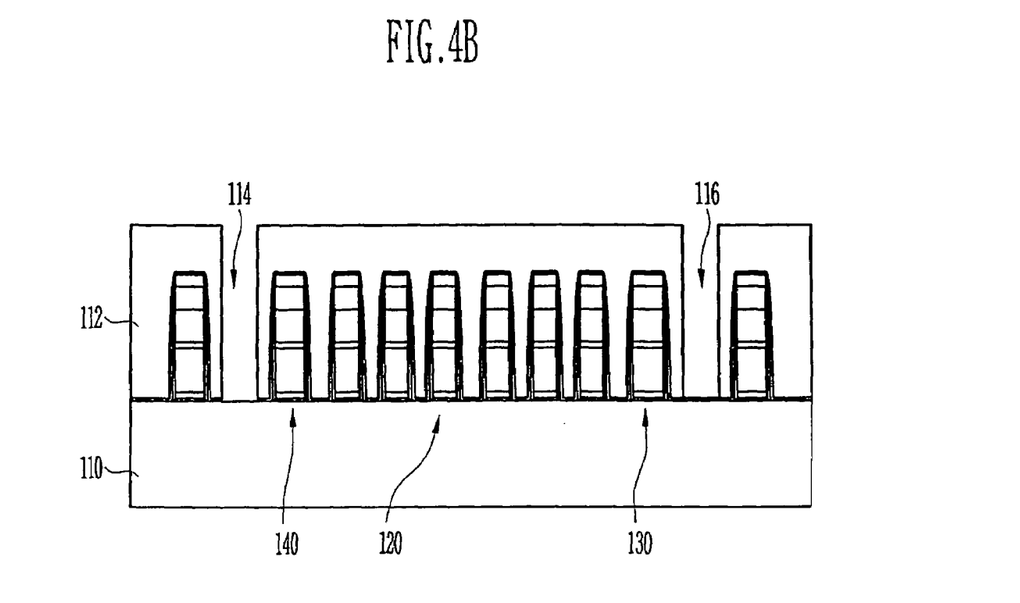

A photoresist film is covered on the first interlayer insulating film 112 having the source line contact hole 114 formed therein. A photolithography process using a photoresist film mask is then performed to form a second photoresist pattern (not shown) through which the drain region is opened. It is possible to cover an anti-reflection film for filling the source line contact hole 114 before the second photoresist pattern is formed.

It is effective that the drain region of the drain select transistor 130 is opened since the device is a NAND flash device. The first interlayer insulating film 112 is removed by means of an etch process using the second photoresist pattern as an etch mask, so that a drain contact hole 116 is formed. The second photoresist pattern is removed by means of a predetermined photoresist film strip process.

Figure 4C:
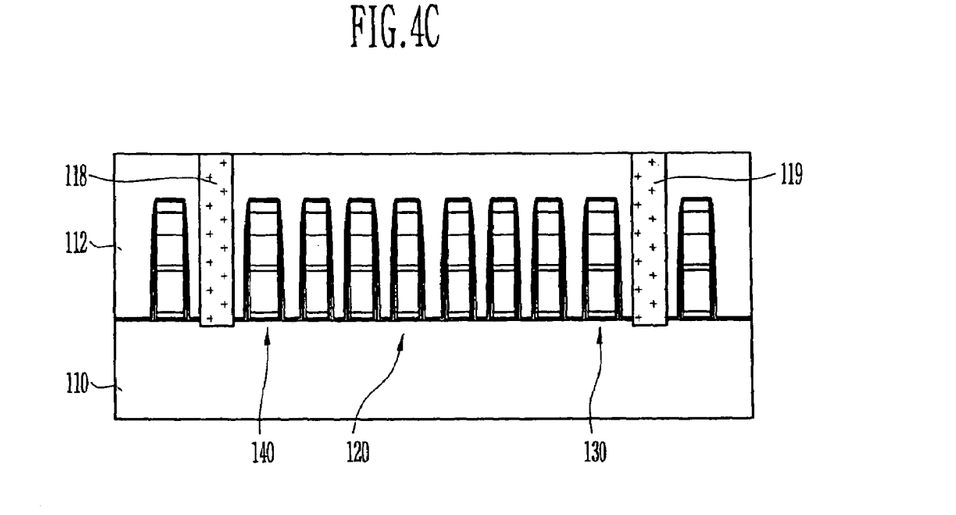

A conductive material film is deposited on the entire structure. The conductive film on the first interlayer insulating film 112 is then removed by means of a polishing process using the first interlayer insulating film 112 as a stop layer, whereby a source line plug 118 and a drain contact plug 119 are formed. It is preferred that the polishing process is performed using blanket etch or chemical mechanical polishing (CMP). In this embodiment, it is effective that chemical mechanical polishing is used. It is possible to perform plug ion implantation in order to maintain the properties of a cell junction before the conductive film is deposited. The conductive material film is preferably formed using a polysilicon film.

Thereafter, a dual damascene process is carried out to form a bit line on the drain contact plug and to form a common source line on the source line contact plug.

Figure 4D:
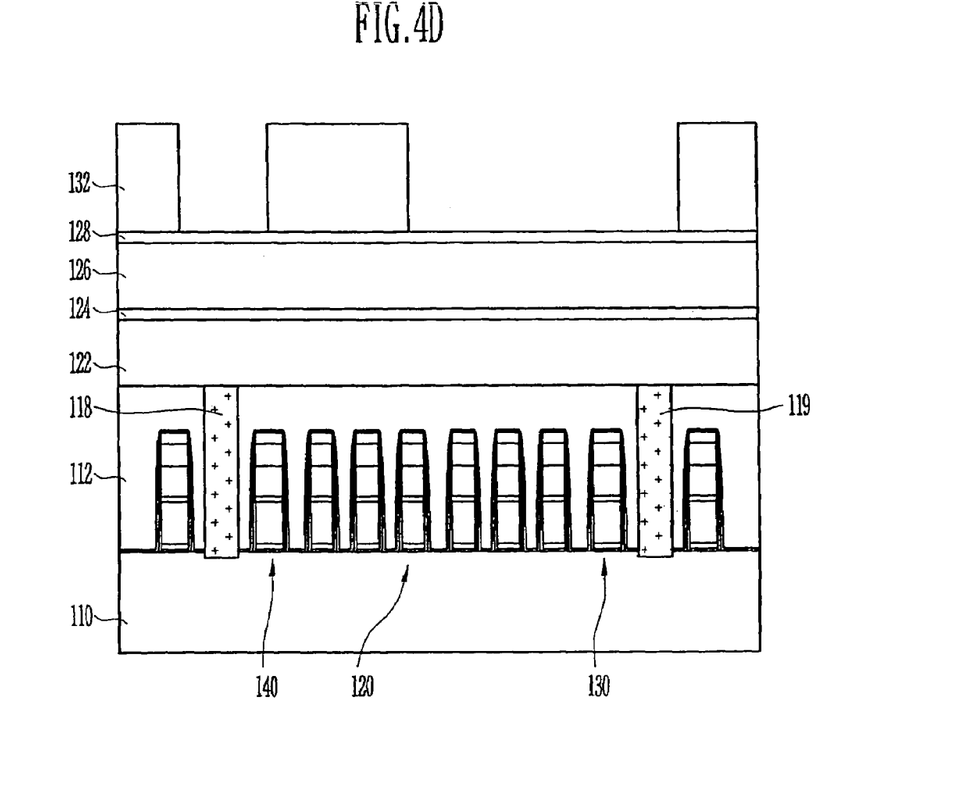
Figure 4E:
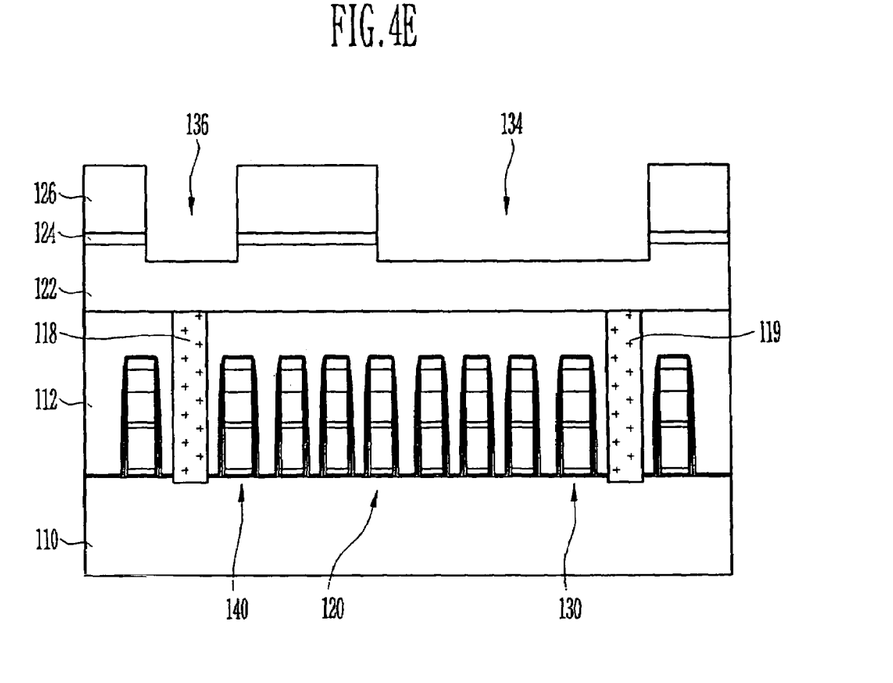

Referring to FIG. 3, FIG. 4D and FIG. 4E, a second interlayer insulating film 122, an etch-stop layer 124 and a third interlayer insulating film 126 are sequentially formed on the first interlayer insulating film 112 having the source line plug 118 and the drain contact plug 119 formed therein. An anti-reflection film 128 and a photoresist pattern 132 are formed on the third interlayer insulating film 126.

An anti-reflection film 128 being an organic bottom ARC for preventing diffused reflection is formed on the third interlayer insulating film 126. A photoresist film is covered on the anti-reflection film 126. A photolithography process using a photoresist film as a mask is performed to form a third photoresist pattern 132 for forming a bit line and a common source line contact. A portion of the anti-reflection film 128, the third interlayer insulating film 126, the etch-stop layer 124 and the second interlayer insulating film 122 are etched by means of an etch process using the third photoresist pattern 132 as an etch mask, forming a first trench 134 and a second trench 136. The first trench is formed over the source line plug 118 and the second trench 136 is formed over the drain contact plug 119. The second trench is larger than the first trench 134.

The third photoresist pattern 132 and the anti-reflection film 128 remaining on the third interlayer insulating film 126 are removed by means of a predetermined strip process. In the above, upon etching of the third interlayer insulating film 126, the etch-stop layer serves as a stop layer so that trenches 134 and 136 of a target depth and thickness can be formed.

Figure 4F:
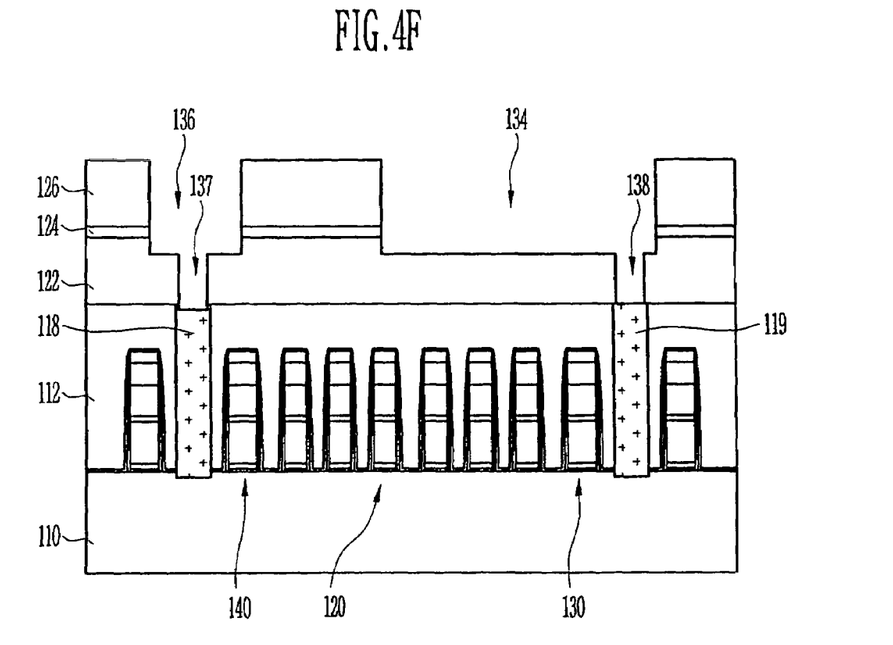
Figure 4G:
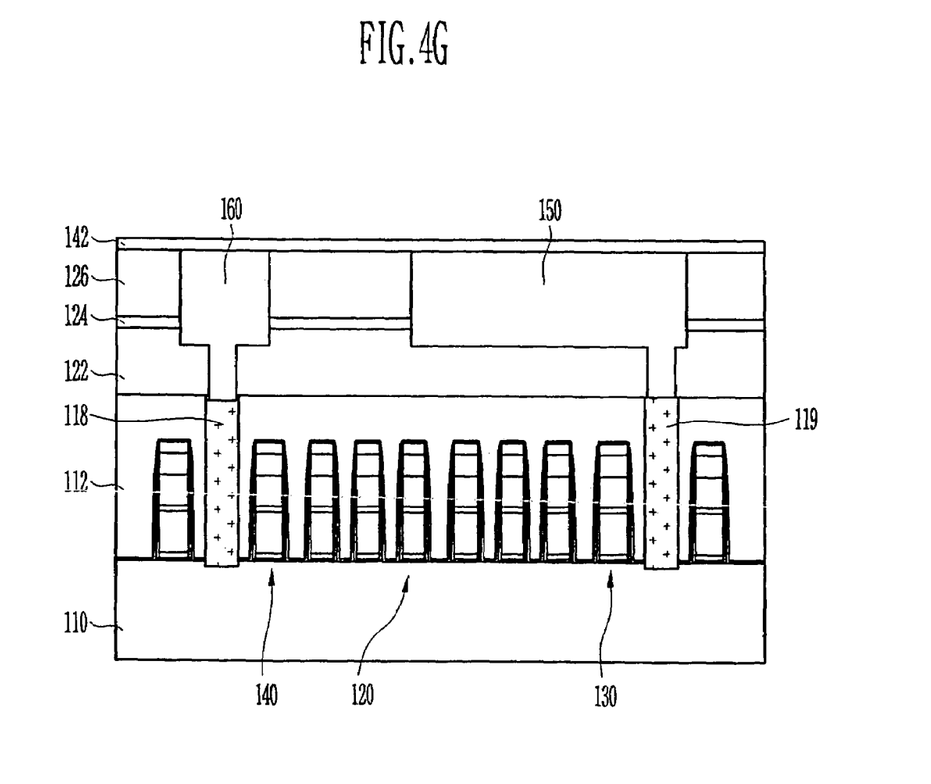

Referring to FIG. 3, FIG. 4F and FIG. 4G, a portion of the second interlayer insulating film 122 below the trenches 134 and 136 are patterned to form a first via hole 138 for a bit line and a second via hole 137 for a common source line, respectively. The contact, the trenches 134 and 136 and the via holes 137 and 138 are filled with a metal film and are then polished, whereby a bit line 150, which is electrically brought into contact with the drain contact plug 119, and a common source line contact 160, which is electrically brought into contact with the source line plug 118, are formed.

A photoresist film is covered on the entire structure on which the first trench 134 for the bit line and the second trench 136 for the common source line are formed. A photolithography process using a mask is then carried out to form a fourth photoresist pattern (not shown) through which the top of the drain contact plug 119 below the trench 134 for the bit line is opened and the top of the source line plug 118 below the second trench 136 for the source line is opened. The second interlayer insulating film 122 is removed by means of an etch process using the fourth photoresist pattern as an etch mask. Thus, the first via hole 138 for the bit line through which the drain contact plug 119 is opened is formed at the bottom of the bit line trench 134, and the second via hole 137 for the source line through which the source line plug 118 is opened at the bottom of the second trench 136 for the common source line. The fourth photoresist pattern is removed by means of a predetermined strip process.

An anti-diffusion film (not shown) is deposited on the entire structure and a metal film is then formed. The metal film on third interlayer insulating film 126 is removed by a polishing process using the third interlayer insulating film 126 as a stop layer, whereby a bit line 150, which is electrically brought into contact with the drain contact plug 119, and a common source line contact 160, which is electrically brought into contact with the source line plug 118, are formed. After a passivation film or a barrier film 142 for protecting a metal wiring, the contact and the plug is covered on the entire structure, a subsequent upper metal wiring formation process is performed.

It is preferred that the first to third interlayer insulating films 112, 122 and 126 are formed using a material film having an electrical insulating property but are formed using a material film of a nitride film series and a material film of an oxide film series. The metal film is preferably formed using at least one of a tungsten film, a copper film and an aluminum film.

According to the present invention described above, after a source line plug hole is formed, a drain contact plug hole is formed. The holes are filled with a conductive material film and are then polished. It is therefore possible to simplify the process since an ion implantation process, a conductive material film burial process and a blanket etch process step are omitted.

Moreover, according to the present invention, loss of a drain contact plug by the blanket etch process is prevented. It is thus possible to improve the electrical properties of a device and reduce the manufacturing cost price.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method for manufacturing a NAND flash device, comprising:

forming a lower interlayer insulating film over the semiconductor substrate including a source line plug and a drain contact plug;

forming an etch-stop layer on the lower interlayer insulating layer;

forming an upper interlayer insulating film on the etch-stop layer;

selectively etching the interlayer insulating film, the etch-stop layer and portions of the lower interlayer insulating layer and forming a first trench over the drain contact plug and a second trench over the source line plug, wherein the first trench is larger than the second trench;

selectively removing the lower interlayer insulating layer and forming a first via hole under the first trench and the second via hole under the second trench, wherein the first via hole exposes the drain contact plug and the second via hole exposes the source line plug;

filling the first trench, the second trench, the first via hole and the second via hole with a metal film; and forming a bit line passing the first trench and the first via hole and a common source line contact passing the second trench and the second via hole by polishing the metal film.

2. The method of claim 1 further comprise the following steps prior to the forming of the lower interlayer insulating film:

providing a semiconductor substrate on which a drain select transistor is formed for selecting a drain terminal of a flash cell and a source select transistor is formed for selecting a source terminal of the flash cell, wherein the drain and source select transistors have drain and source regions respectively;

forming a first interlayer insulating film over the semiconductor substrate; removing a portion of the first interlayer insulating film to form a source line contact hole, wherein the source region of the source select transistor is exposed at a bottom of the source line contact hole;

removing a portion of the first interlayer insulating film to form a drain contact hole, wherein the drain region of the drain select transistor is exposed at a bottom of the drain contact hole; and forming a source line plug in a drain contact plug in the source line contact hole and drain contact hole, respectively.

3. The method of claim 2, further comprising implanting impurities into the source and drain regions.

4. The method of claim 2, further comprising implanting impurities into exposed regions of the source and drain regions disposed at bottom portions of the source line contact hole and drain contact hole respectively.

* * * * *